United States Patent
Ahmed et al.

(10) Patent No.: US 10,644,705 B1
(45) Date of Patent: May 5, 2020

(54) METHOD AND SYSTEM FOR GRID-CONNECTED CONVERTER FAST RECOVERY AFTER GRID DISTURBANCE

(71) Applicant: Emirates Steel Industries PJSC, Musaffah, Abu Dhabi (AE)

(72) Inventors: Hany Abdelmonem Hamed Ahmed, Mohammed Ben Zayed (AE); Ahmed Fathi Ahmed Abdou, Ngunnawal (AU); Ehab Hassan Eid Bayoumi, Cairo (EG); Elwy Eissa Ahmed Elkholy, Menofia Governorate (EG)

(73) Assignee: Emirates Steel Industries Co. PJSC, Musaffah, Abu Dhabi (AE)

( * ) Notice: Subject to any disclaimer, the term of this patent is extended or adjusted under 35 U.S.C. 154(b) by 0 days.

(21) Appl. No.: 16/161,599

(22) Filed: Oct. 16, 2018

(51) Int. Cl.
| | |
|---|---|
| H02J 3/00 | (2006.01) |
| H03L 7/08 | (2006.01) |
| G05B 13/02 | (2006.01) |
| H02P 27/06 | (2006.01) |
| H02J 3/36 | (2006.01) |
| H02K 7/18 | (2006.01) |

(52) U.S. Cl.
CPC .......... H03L 7/08 (2013.01); G05B 13/0275 (2013.01); H02J 3/36 (2013.01); H02P 27/06 (2013.01); *H02J 2003/001* (2013.01); *H02K 7/183* (2013.01)

(58) Field of Classification Search
CPC ... H03L 7/08; G05B 13/0275; H02J 2003/001
See application file for complete search history.

(56) References Cited

U.S. PATENT DOCUMENTS

| | | | |
|---|---|---|---|
| 2005/0151377 A1* | 7/2005 | Ichinose | F03D 7/026 290/44 |
| 2009/0109713 A1* | 4/2009 | Schnetzka | H02M 5/4585 363/34 |

* cited by examiner

*Primary Examiner* — Cortez M Cook
(74) *Attorney, Agent, or Firm* — Sughrue Mion, PLLC

(57) ABSTRACT

A method and system of controlling a power converter coupled between a power generator and an electric grid. The method comprises detecting a grid disturbance voltage dip event while the power converter operates in a first phase locked loop (PLL) control mode that establishes a state of synchronization with the electric grid, the power converter electrically coupled to either motor drive inverter or grid-tie inverter, detecting a loss of the state of synchronization with the electric grid in conjunction with progressive charge depletion from a charged state of the dc-link capacitors, switching the converter to a diode mode of operation, switching from the first PLL control mode to a second PLL control mode of operation of the power converter, and re-establishing the state of synchronization to timely pre-empt progressive depletion of charge from the dc-link capacitors while under the second PLL control mode of operation of the power converter.

18 Claims, 5 Drawing Sheets

400

```
┌─────────────────────────────────────────────────┐
│ Detect a low voltage grid disturbance event while a │
│ converter operates in a first PLL control mode that │
│ establishes a state of synchronization with the grid,│
│ the converter being electrically coupled to an       │
│ energy storage device within the grid               │
│                                              410    │
└─────────────────────────────────────────────────┘
                         │
                         ▼
┌─────────────────────────────────────────────────┐
│ Detect a loss of the state of synchronization in    │
│ conjunction with progressive charge depletion from  │
│ a charged state of the energy storage device        │
│                                              420    │
└─────────────────────────────────────────────────┘
                         │
                         ▼
┌─────────────────────────────────────────────────┐
│ Switching the converter to a diode mode of          │
│ operation                                           │
│                                              430    │
└─────────────────────────────────────────────────┘
                         │
                         ▼
┌─────────────────────────────────────────────────┐
│ Switch from the first PLL control mode to a second  │
│ PLL control mode of operation of the converter      │
│                                              440    │
└─────────────────────────────────────────────────┘
                         │
                         ▼
┌─────────────────────────────────────────────────┐
│ Re-establish the state of synchronization to timely │
│ pre-empt progressive depletion of charge while      │
│ under the second PLL control mode of operation of   │
│ the converter                                       │
│                                              450    │
└─────────────────────────────────────────────────┘
```

FIG. 4

METHOD AND SYSTEM FOR GRID-CONNECTED CONVERTER FAST RECOVERY AFTER GRID DISTURBANCE

TECHNICAL FIELD

The disclosure herein relates to methods and systems for controlling a power converter coupled between a power generator and an electric grid.

BACKGROUND

Electrical grids are susceptible to severe short duration voltage dips that frequently result in tripping of power converters, resulting in adverse effects upon industrial manufacturing facilities and other grid customers. The reason for the converter trip is typically a synchronization error or synchronization loss between converter and grid that is caused by the severe short duration voltage dip. Since converters need a relatively long time to resume its normal operation after dip recovery due to the capacitors undergoing requisite pre-charging process, converter control solutions which may minimize or substantially eliminate the converter recovery time are highly desired.

BRIEF DESCRIPTION OF THE DRAWINGS

FIG. 4 illustrates an example embodiment method of operation of a power converter control module.

DETAILED DESCRIPTION

Figure 1:
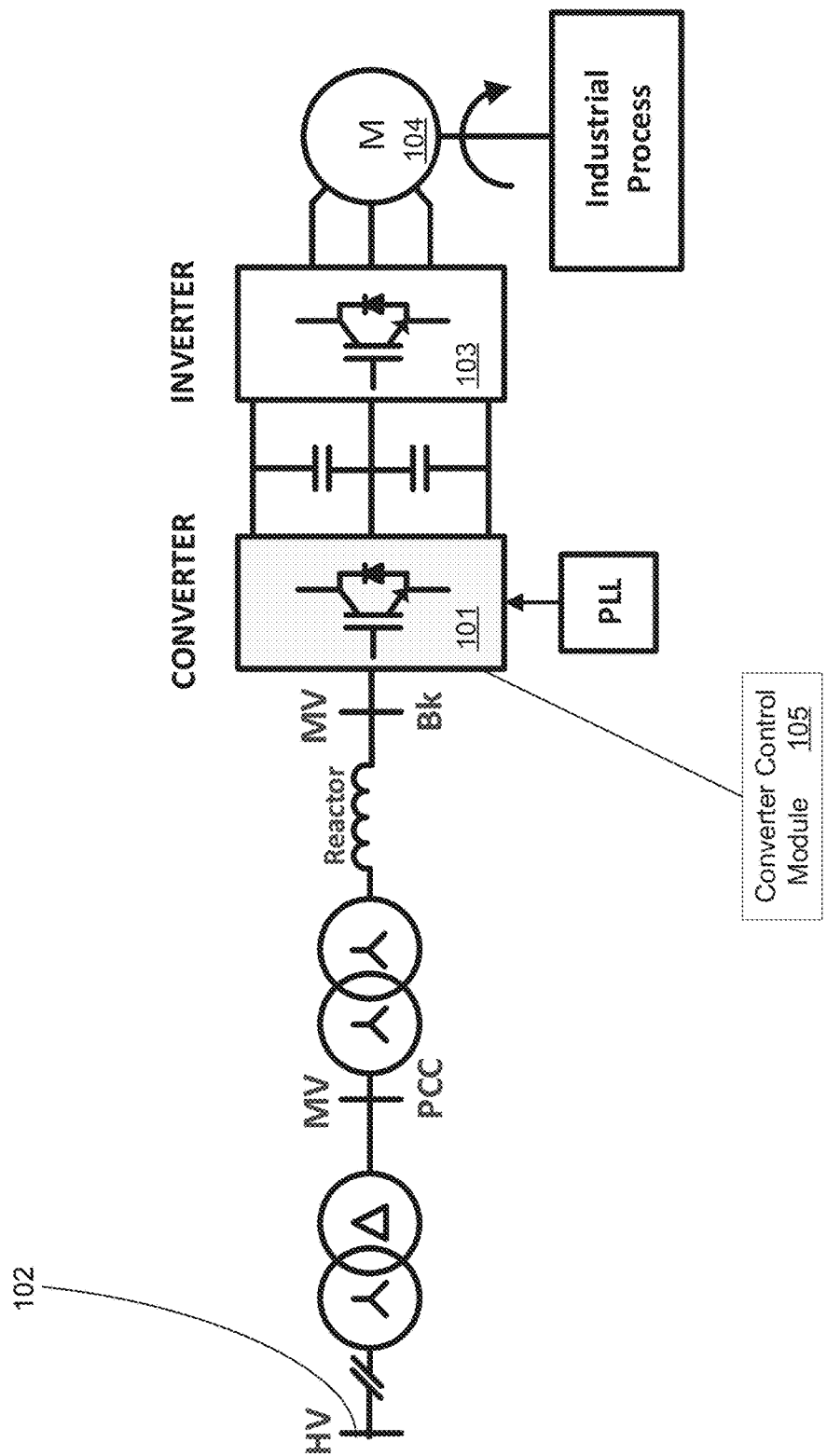
FIG. 1 illustrates an example embodiment of a grid-connected power converter.

The disclosure herein provides novel and advantageous hybrid phase locked loop (PLL)-based control schemes that achieve a very fast synchronization between a grid and power converter after an initial loss of synchronization due to a severe short duration voltage dip. The disclosure herein provides a ride-through control sequence and a hybrid structure PLL converter control method and system to pre-empt the dc-link capacitor discharging and to minimize the duration of synchronization loss after the dip is cleared. The hybrid scheme utilizes a single-input fuzzy logic controller (SFLC) to achieve a very fast synchronization after dip recovery and uses the ride-through sequence to maintain the dc link voltage above a minimum threshold level and maintain the capacitor in a charged state during the loss of synchronization. By pre-empting energy discharge from the capacitor device, the converter resumes normal operation once synchronization is re-established, and normal operation of the grid is therefore re-enabled in a faster timeframe.

Provided is a method of controlling a power converter coupled between a power generator and an electric grid. The method comprises detecting a grid disturbance voltage dip event while the power converter operates in a first phase locked loop (PLL) control mode that establishes a state of synchronization with the electric grid, the power converter electrically coupled to either motor drive inverter or grid-tie inverter, detecting a loss of the state of synchronization with the electric grid in conjunction with progressive charge depletion from a charged state of the dc-link capacitors, switching the converter to a diode mode of operation, switching from the first PLL control mode to a second PLL control mode of operation of the power converter, and re-establishing the state of synchronization to timely pre-empt progressive depletion of charge from the dc-link capacitors while under the second PLL control mode of operation of the power converter.

In one embodiment, the first PLL mode comprises a synchronous reference frame (SRF) PLL.

In another embodiment, in the diode mode, converter pulses are inhibited, thereby forcing the converter to conduct current through a set of anti-parallel diode devices.

In yet another embodiment, the second PLL control mode of operation of the power converter comprises a single input fuzzy logic controller (SFLC).

In one variation, the method further comprises re-enabling the first PLL control mode subsequent to re-establishing the state of synchronization.

In yet another embodiment, the method further comprises, while in the SFLC-PLL mode, re-establishing the state of synchronization within 0.01 (10 milliseconds) after clearance of the grid fault event.

Also provided is a power converter control module coupled to either motor drive inverter or grid-tie inverter. The power converter control module includes a processor, and a memory storing instructions. The instructions are executable in the processor to detect a grid disturbance voltage dip event while the power converter operates in a first phase locked loop (PLL) control mode under which a state of synchronization is established with the electric grid, the power converter being electrically coupled to an energy either motor drive inverter or grid-tie inverter, detect a loss of the state of synchronization with the electric grid in conjunction with progressive charge depletion from a charged state of the dc-link capacitors, switch the converter to a diode mode of operation, switch from the first PLL control mode to a second PLL control mode of operation of the power converter, and re-establish the state of synchronization to timely pre-empt progressive depletion of charge from dc-link capacitors while under the second PLL control mode of operation of the power converter.

Further provided is a non-transitory computer readable memory storing instructions. The instructions are executable in a processor to detect a grid disturbance voltage dip event while the power converter operates in a first phase locked loop (PLL) control mode that establishes a state of synchronization with the electric grid, the power converter being electrically coupled to either motor drive inverter or grid-tie inverter, detect a loss of the state of synchronization with the electric grid in conjunction with progressive charge depletion from a charged state of the dc-link capacitors, switch the converter to a diode mode of operation, switch from the first PLL control mode to a second PLL control mode of operation of the power converter, and re-establish the state of synchronization to timely pre-empt progressive depletion of charge from the dc-link capacitors while under the second PLL control mode of operation of the power converter.

One or more embodiments described herein can be implemented using programmatic modules, engines, or components. A programmatic module, engine, or component can include a program, a sub-routine, a portion of a program, or a software component or a hardware component capable of performing one or more stated tasks or functions. As used herein, a module or component can exist on a hardware component independently of other modules or components. Alternatively, a module or component can be a shared element or process of other modules, programs or machines.

Furthermore, one or more embodiments described herein may be implemented through the use of logic instructions that are executable by one or more processors. These instructions may be carried on a computer-readable medium. In particular, machines shown with embodiments herein include one or more processors and various forms of memory for storing data and processor-executable instructions. Embodiments described herein may be implemented in the form of computer processor-executable logic instructions or programs stored on computer memory mediums.

FIG. 1 illustrates, in an example embodiment 100, a grid-connected power converter 101. Power converter 101 is electrically connected with electrical grid 102, and to AC motor 104. Inverter 103, which may be a capacitor device in one embodiment, may be electrically interposed between power converter 101 and AC motor 104. Power converter 101 may be electrically controlled via converter synchronization control module 105. Converter synchronization control module 105 may include any combination of hardware elements, electrical circuitry and encoded software instructions, in one example embodiment, a processor and a non-transient memory storing instructions executable in the processor to control functioning and response of power converter 101 within electrical grid 102. In one embodiment, converter synchronization control module 105 may include capability for operating power converter 101 under hybrid phase locked loop (PLL) modes of control.

Figure 2:
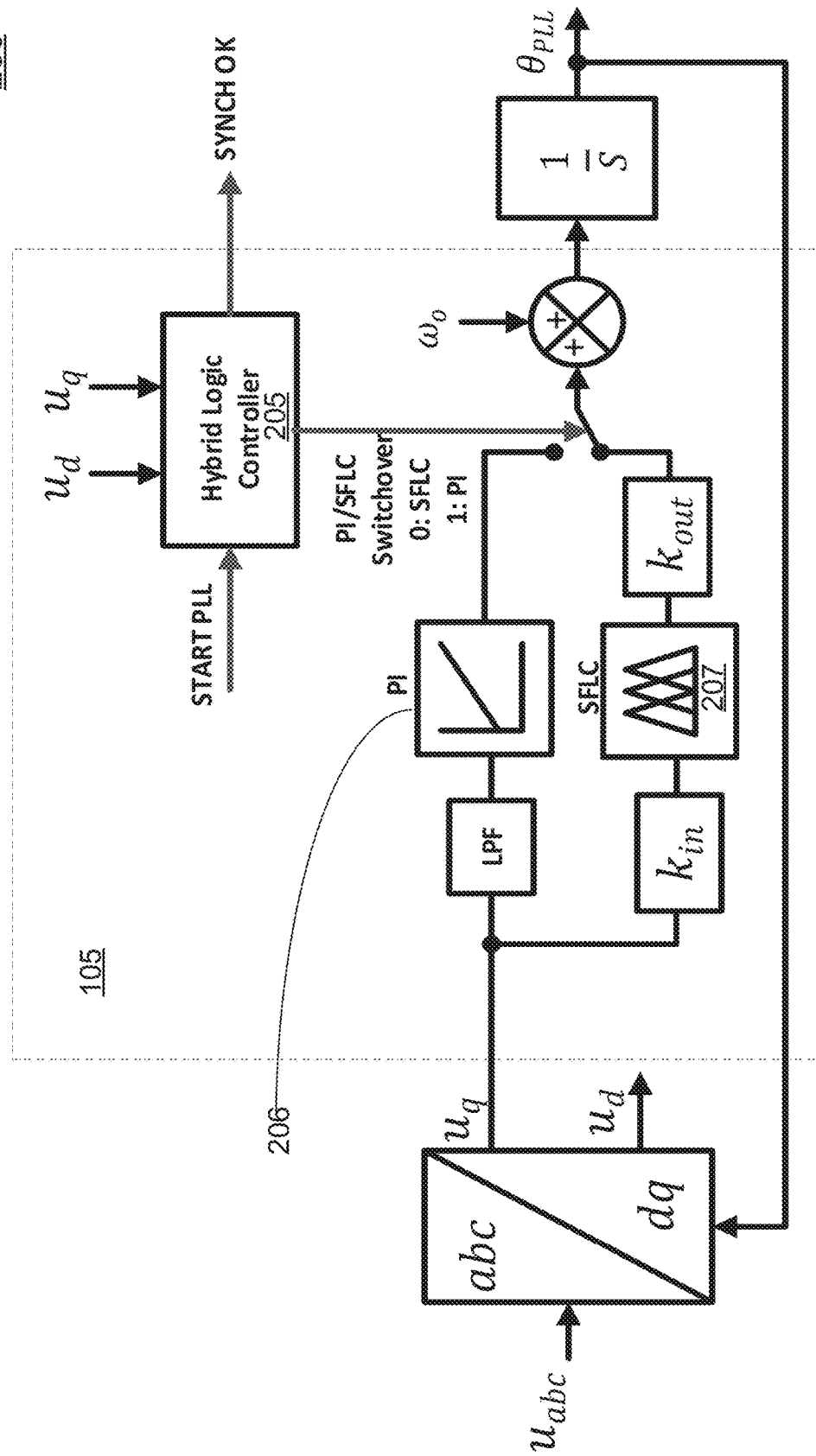
FIG. 2 illustrates an example embodiment architecture of a power converter synchronization control module.

FIG. 2 illustrates, in one example embodiment, an architecture 200 of power converter synchronization control module 105. The hybrid control structure of power converter synchronization control module 105 of FIG. 2 includes two control blocks in conjunction with hybrid logic controller 205. The first control block is a conventional three-phase SRF-PLL 206 with in-loop low-pass filter (LPF). The SRF-PLL 206 is the main synchronization scheme during normal operation, tracking both the grid voltage phase angle and the grid frequency for reference signal generation for the converter controller modules. In one embodiment, a severe short duration voltage dip may be detected by evaluating the negative sequence component of the grid voltage dq-axis value and determining whether that dq-axis value of the grid voltage exceeds a threshold limit.

In an embodiment, the loss of synchronization between power converter 101 and grid 102 may be detected when the amplitude of negative sequence grid voltage component breaches the maximum negative sequence unlock threshold value.

The second block utilizes a single input fuzzy logic controller (SFLC) 207 to quickly estimate the grid angle once the voltage dip is recovered. Controller gain or scaling factors $k_{in}$ and $k_{out}$ are used to control the dynamic response of SFLC control mode 207. Hybrid logic controller 205 engages the fuzzy logic controller (SFLC) 207 scheme once the voltage dip is cleared and reverts to SRF-PLL 206 scheme when positive grid voltage q-axis component drops below a switchover limit.

The SFLC 207 control mode may be kept operational and online until the converter starts modulation for normal operation, whereupon the conventional SRF-PLL 206 control mode may be invoked and re-enabled. The control scheme of converter synchronization control module 105 using the hybrid control scheme disclosed herein, resynchronizes the power converter 101 with the electrical grid quickly, in one embodiment in less than 0.01 second (10 milliseconds), to avoid converter tripping consequences which may include progressive discharge of dc-link capacitors. Energy converting device 103 may be a inverter, in one embodiment.

Figure 3:
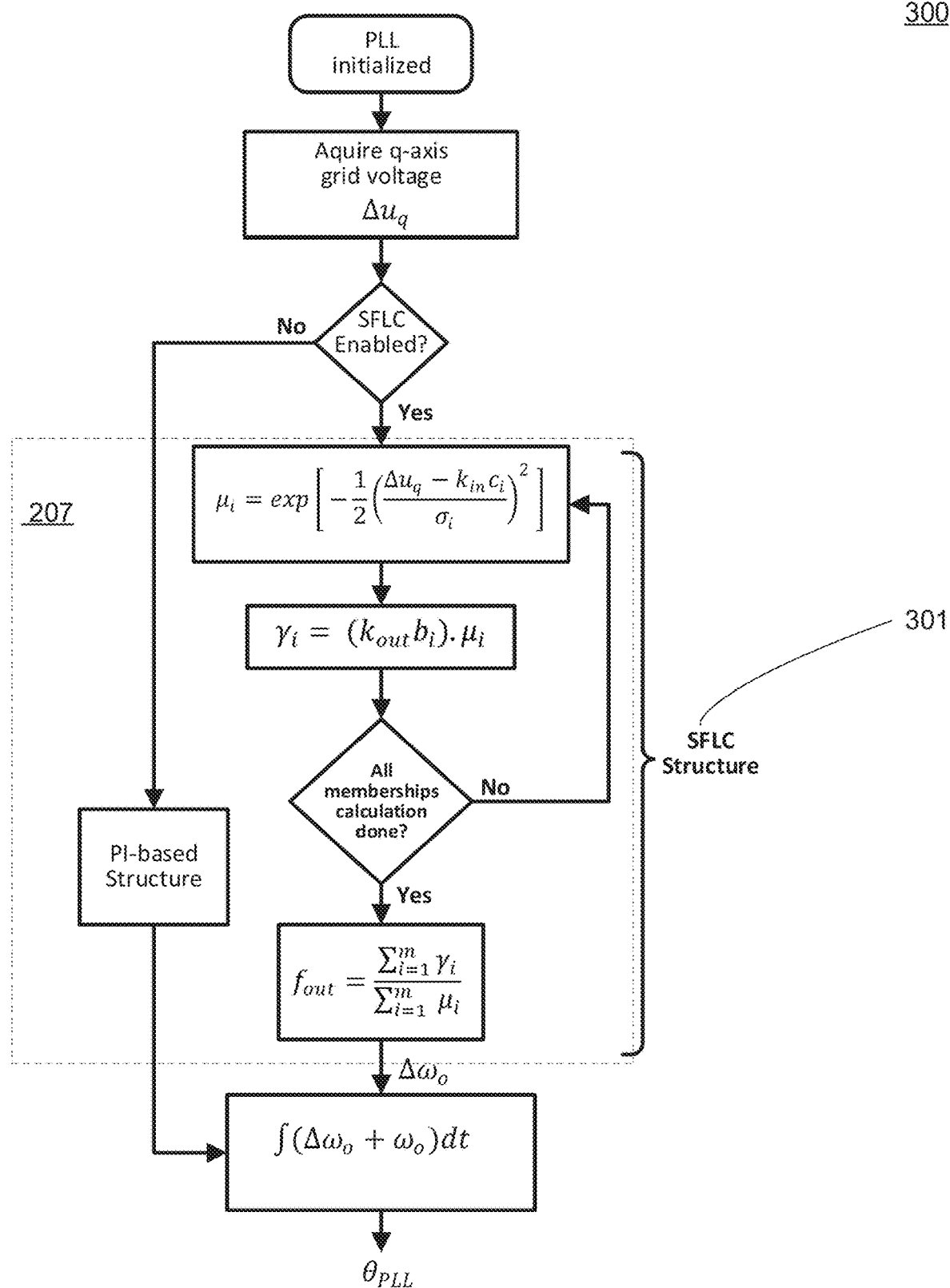
FIG. 3 illustrates, in an example embodiment, a single input fuzzy logic control module.

FIG. 3 illustrates an algorithm structure 301 of single input fuzzy logic control (SFLC) module 207, in example embodiment 300. The SFLC uses $\Delta u_g$ as an error signal. The fuzzification process is performed by a Gaussian membership function given as $$\mu(x) = \exp\left(-\frac{(c-x)^2}{2\sigma^2}\right)$$

where c and $\sigma$ are the centre and width of the Gaussian function respectively.

The output of the SFLC 301 is ($\Delta\omega_o$). The estimated angle ($\theta_{PLL}$) is calculated from $$\theta_{PLL} = \int(\omega_o + \Delta\omega_o)$$

where $\omega_o$ is the grid angular frequency. The input signal $\Delta u_q$ is fuzzified by 'i' membership functions according to the distance between the input and the membership centre value $c_i$ as follows $$\mu_i = \exp\left[-\frac{1}{2}\left(\frac{x-c_i}{\sigma_i}\right)^2\right]$$

The SFLC output is calculated by a crisp function using the weighted average method, where $b_i$ is the output membership function centers. The input signal is scaled by gain $k_{in}$ while the output of SFLC is scaled by a gain $k_{out}$ $$\mu_i = \exp\left[-\frac{1}{2}\left(\frac{\Delta u_q - k_{in} c_i}{\sigma_i}\right)^2\right]$$

$$\gamma_i = (k_{out} b_i) \cdot \mu_i$$

The output is calculated as $$\Delta\omega_o = \frac{\sum_{i=1}^{m} \gamma_i}{\sum_{i=1}^{m} \mu_i}$$

The algorithm of the SFLC 301 is called for each execution sample to obtain the proper $\Delta\omega_o$. Five Gaussian membership functions are used with a $\sigma$ of 0.5. The membership centers are equally distributed from −1 to 1 range. The output centers, vector $b_i$ also consists of 5 crisps, equally distributed similarly. A scaling factors $k_{in}$ and $k_{out}$ are used to control the SFLC dynamic response of SFLC control mode 207.

FIG. 4 illustrates, in an example embodiment method 400 of FIG. 4, a method of operation of a power converter synchronization control module 105. In describing the example of FIG. 4, reference is made to the examples of FIGS. 1-3 for purposes of illustrating suitable components or elements for performing a step or sub-step being described.

At step 410, detecting a grid disturbance voltage dip event while the power converter 101 operates in a first phase locked loop (PLL) control mode 206 that establishes a state of synchronization with the electric grid 102, the power converter electrically coupled to either motor drive inverter or grid-tie inverter 103 within the electric grid 102.

In one embodiment, a severe short duration voltage dip may be detected by evaluating the negative sequence component of the grid voltage dq-axis value and determining whether that dq-axis value of the grid voltage exceeds a threshold limit.

In another embodiment, the first PLL mode 206 comprises a synchronous reference frame (SRF) PLL.

At step 420, detecting a loss of the state of synchronization with the electric grid 102 in conjunction with progressive charge depletion from a charged state of the dc-link capacitors. In an embodiment, the loss of synchronization between power converter 101 and grid 102 may be detected when the amplitude of negative sequence grid voltage component breaches the maximum negative sequence unlock threshold value.

At step 430, switching the converter to a diode mode of operation using a set of anti-parallel diodes, by blocking the converter pulses, thus forcing the converter to work in the diode mode to preserve the dc-link capacitors voltage.

At step 440, switching from the first PLL control mode 206 to a second PLL control mode 207 of operation of the power converter 101.

In yet another embodiment, the second PLL control mode 207 of operation of the power converter 101 comprises a single input fuzzy logic controller (SFLC) 301.

At step 450, re-establishing the state of synchronization and initiating re-charge of the dc-link capacitors by restoring the normal converter control scheme while under the second PLL control mode 207 of operation of the power converter 101.

In one variation, the method further comprises re-enabling the first PLL control mode 206 subsequent to re-establishing the state of synchronization of power converter 101, hence its normal operation with electric grid 102.

In another variation, the method further comprises re-establishing the state of synchronization of power converter 101 with electric grid 102 within a relatively short duration, such as less than 10 ms in one embodiment, after clearance of the grid fault event.

In other embodiments, the method steps described may be embodied as processor-executable instructions stored in a non-transitory storage medium or memory and incorporated into, or made communicatively accessible to, any one or more of an electrical grid controller device, a power converter controller device, a terminal computing device or a server computing device.

Figure 5A:
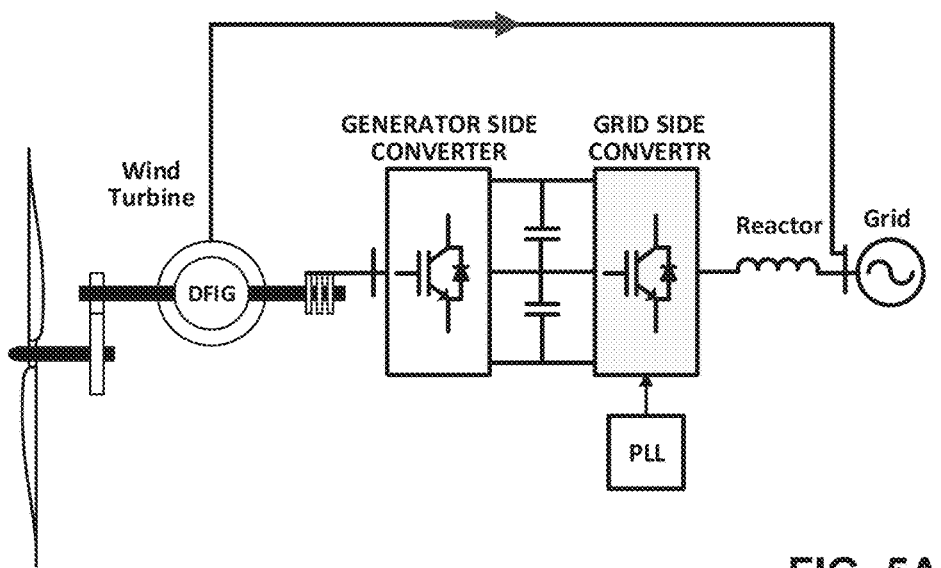
FIG. 5A illustrates a further example application case of the invention herein to a grid-connected converter for wind turbine system.
Figure 5B:
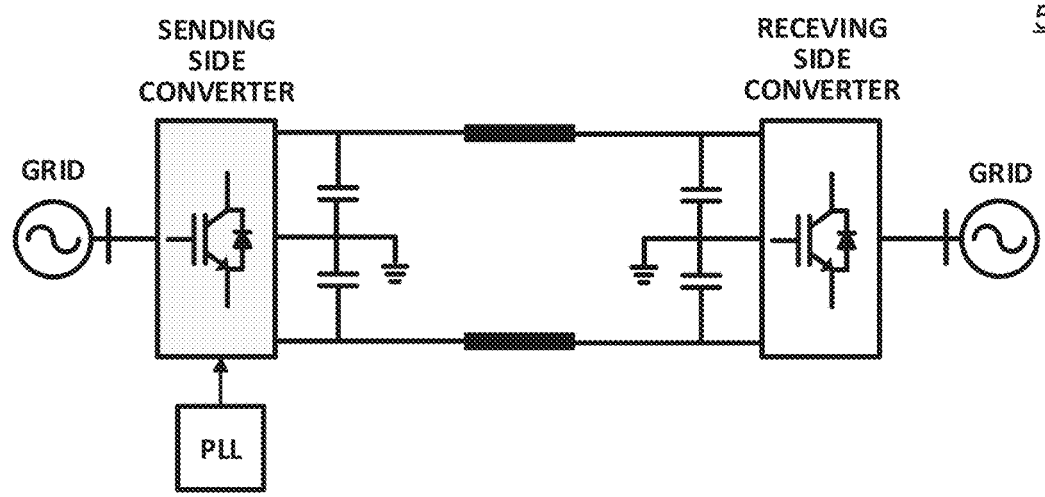
FIG. 5B illustrates a further example application case of the invention herein to a grid-connected converter for HVDC system.

It is contemplated for embodiments described herein to extend to individual elements and concepts described herein, independently of other concepts, ideas or system, and also for the embodiments to include combinations of elements recited throughout this application. Although embodiments are described in detail herein with reference to the accompanying drawings, it is contemplated that the invention is not limited to such embodiments. As such, many modifications and variations will be apparent to practitioners skilled in this art. For instance, and by way of illustration of additional examples of applying the invention disclosed herein, FIG. 5A illustrates a further example application case of the invention herein to a grid-connected converter for wind turbine system 501. FIG. 5B illustrates a further example application case of the invention herein to a grid-connected converter for HVDC system 502.

Accordingly, it is intended that the scope of the invention be defined by the following claims and their equivalents. Furthermore, it is contemplated that a particular feature described either individually or as part of an embodiment can be combined with other individually described features, or parts of other embodiments, even if the other features and embodiments make no specific mention of the particular combination of features. Thus, any absence of describing combinations should not preclude the inventors from claiming rights to such combinations.

What is claimed is:

1. A method of controlling a power converter coupled between a power generator and an electric grid, the method comprising:
   detecting a grid disturbance voltage dip event while the power converter operates in a first phase locked loop (PLL) control mode that establishes a state of synchronization with the electric grid, the power converter electrically coupled to one of a motor drive inverter and a grid-tie inverter;
   detecting a loss of the state of synchronization with the electric grid;
   operating the converter in a diode mode to preserve a charged state of the dc-link capacitors;
   switching from the first PLL control mode to a second PLL control mode of operation of the power converter; and
   re-establishing the state of synchronization to timely pre-empt progressive depletion of charge from the dc-link capacitors while under the second PLL control mode of operation of the power converter.

2. The method of claim 1 wherein the first PLL mode comprises a synchronous reference frame (SRF) PLL.

3. The method of claim 1 wherein, in the diode mode, converter pulses are inhibited, inhibited, thereby forcing the converter to conduct current through a set of anti-parallel diode devices.

4. The method of claim 1 wherein the second PLL control mode of operation of the power converter comprises a single input fuzzy logic controller (SFLC).

5. The method of claim 1 further comprising re-enabling the first PLL control mode subsequent to re-establishing the state of synchronization.

6. The method of claim 1 wherein the timely pre-emption comprises re-establishing the state of synchronization within 0.01 second after clearance of the grid fault event.

7. A power converter control module coupled to one of a motor drive inverter and a grid-tie inverter, the power converter control module comprising:
   a processor;
   a memory storing instructions executable in the processor to:
      detect a grid disturbance voltage dip event while the power converter operates in a first phase locked loop (PLL) control mode that establishes a state of synchronization with the electric grid, the power converter electrically coupled to either motor drive inverter or grid-tie inverter;
      detect a loss of the state of synchronization with the electric grid in conjunction with progressive charge depletion from a charged state of the dc-link capacitors;
      operate the converter in a diode mode to preserve the charged state of the dc-link capacitors;

switch from the first PLL control mode to a second PLL control mode of operation of the power converter; and re-establish the state of synchronization to timely preempt progressive depletion of charge from the dc-link capacitors while under the second PLL control mode of operation of the power converter.

8. The power converter control module of claim 7 wherein the first PLL mode comprises a synchronous reference frame (SRF) PLL.

9. The power converter control module of claim 7 wherein, in the diode mode, converter pulses are inhibited, inhibited, thereby forcing the converter to conduct current through a set of anti-parallel diode devices.

10. The power converter control module of claim 7 wherein the second PLL control mode of operation of the power converter comprises a single input fuzzy logic controller (SFLC).

11. The power converter control module of claim 7 further comprising instructions executable in the processor to re-enable the first PLL control mode subsequent to re-establishing the state of synchronization.

12. The power converter control module of claim 7 wherein the instructions are executable in the processor to re-establish the state of synchronization within 0.01 second after clearance of the grid fault event.

13. A non-transitory computer readable memory storing instructions, the instructions executable in a processor to:

detect a grid disturbance voltage dip event while the power converter operates in a first phase locked loop (PLL) control mode that establishes a state of synchronization with the electric grid, the power converter electrically coupled to one of a motor drive inverter and a grid-tie inverter;

detect a loss of the state of synchronization with the electric grid in conjunction with progressive charge depletion from a charged state of the dc-link capacitors;

operate the converter in a diode mode to preserve the charged state of the dc-link capacitors;

switch from the first PLL control mode to a second PLL control mode of operation of the power converter; and re-establish the state of synchronization to timely preempt progressive depletion of charge from the dc-link capacitors while under the second PLL control mode of operation of the power converter.

14. The non-transitory computer readable memory of claim 13 wherein the first PLL mode comprises a synchronous reference frame (SRF) PLL.

15. The non-transitory computer readable memory of claim 13 wherein, in the diode mode, converter pulses are inhibited, inhibited, thereby forcing the converter to conduct current through a set of anti-parallel diode devices.

16. The non-transitory computer readable memory of claim 13 wherein the second PLL control mode of operation of the power converter comprises a single input fuzzy logic controller (SFLC).

17. The non-transitory computer readable memory of claim 13 further comprising instructions executable in the processor to re-enable the first PLL control mode subsequent to re-establishing the state of synchronization.

18. The non-transitory computer readable memory of claim 13 wherein the instructions are executable in the processor to re-establish the state of synchronization within 0.01 second after clearance of the grid fault event.

* * * * *